United States Patent
Miller et al.

(10) Patent No.: US 6,752,844 B2
(45) Date of Patent: *Jun. 22, 2004

(54) CERIC-ION SLURRY FOR USE IN CHEMICAL-MECHANICAL POLISHING

(75) Inventors: Anne E. Miller, Portland, OR (US); A. Daniel Feller, Portland, OR (US); Kenneth C. Cadien, Portland, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/280,268

(22) Filed: Mar. 29, 1999

(65) Prior Publication Data

US 2002/0053656 A1 May 9, 2002

(51) Int. Cl.⁷ .................................................. C09C 1/68
(52) U.S. Cl. .......................... 51/307; 51/308; 51/309; 438/691; 438/692; 438/693
(58) Field of Search .................. 438/691, 692, 438/693; 51/307, 308, 309; 252/79.1, 89.2; 215/88, 89

(56) References Cited

U.S. PATENT DOCUMENTS

| | | | | |
|---|---|---|---|---|
| 4,944,836 A | * | 7/1990 | Beyer et al. | 156/645 |
| 4,959,113 A |   | 9/1990 | Roberts | 156/636 |
| 5,759,917 A | * | 6/1998 | Grover et al. | 51/309 |
| 5,773,364 A | * | 6/1998 | Farkas et al. | 438/692 |
| 5,916,819 A | * | 6/1999 | Skrovan et al. | 438/692 |
| 5,954,997 A | * | 9/1999 | Kaufman et al. | 252/79.1 |
| 6,063,306 A | * | 5/2000 | Kaufman et al. | 252/79.4 |
| 6,083,419 A | * | 7/2000 | Grumbine et al. | 251/79.1 |
| 6,136,711 A | * | 10/2000 | Grumbine et al. | 216/89 |

OTHER PUBLICATIONS

Cook, Lee M., "Chemical Processes in Glass Polishing", Journal of Non–Crystalline Solids, 120:152–171, 1990.
V. Brusic, et al. "Electromechanical Approach to Au and Cu CMP Process Development" by the Electromechanical Society Proceeding vol. 96–22; pp. 176–185.
Robert Walker, "Benzotriazole a Corrosion Inhibitor for Antiques", Journal of Chemical Education, vol. 57; 1980; pp. 789–791.
J. Farkas, et al. "Oxidation and Etching of Tungsten in CMP Slurries" by Conference Proceedings ULSI; Materials Research Society; pp. 25–32.

* cited by examiner

*Primary Examiner*—Nadine G. Norton
*Assistant Examiner*—Duy-Vu Deo
(74) *Attorney, Agent, or Firm*—Blakely, Sokoloff, Taylor & Zafman LLP

(57) ABSTRACT

The invention provides a chemical-mechanical polishing slurry comprising a liquid, cerium ions as an oxidizer, an abrasive, and a pH increasing substance. The cerium ions are in the liquid in a quantity equal to the inclusion of at least 0.02 molar ammonium cerium nitrate in the liquid. The abrasive is also included in the liquid. The liquid, the cerium ions and the abrasive jointly have a first pH value. The pH increasing substance increases the first pH value to a second pH value above 1.5.

13 Claims, 1 Drawing Sheet

CERIC-ION SLURRY FOR USE IN CHEMICAL-MECHANICAL POLISHING

BACKGROUND OF THE INVENTION

1). Field of the Invention

The present invention relates to a slurry for use in chemical-mechanical polishing of a metal film on a semiconductor substrate.

2). Discussion of Related Art

The manufacture of integrated circuits involves the fabrication of multiple electronic devices such as transistors, diodes and capacitors in and on a silicon or other semiconductor wafer, and then interconnecting the devices with metal lines, plugs and vias.

During the manufacture of an integrated circuit, a number of layers of different materials are alternately deposited on one another and then partially removed. For example, during the formation of metal lines, a metal layer may be blanket deposited over the entire wafer so that metal of the metal layer covers higher areas on the wafer and fills trenches between the higher areas. The metal layer is then partially removed so that the higher areas are exposed and metal lines are left behind in the trenches.

One technique for removal of layers on a wafer is known in the art as "chemical-mechanical polishing". In a chemical-mechanical polishing operation, a chemical-mechanical polishing slurry is applied over the metal layer which serves both a chemical and a mechanical function.

Chemically, a slurry of the above kind usually includes an oxidizer which oxidizes the metal layer by removal of electrons therefrom. An easily removable oxidized film is so formed by an upper portion of the metal film.

Mechanically, a slurry of the above kind also includes an abrasive such as silica ($SiO_2$) or ceria ($CeO_2$). The purpose of the abrasive is to abrade the oxidized film when a polishing pad is pressed against and moved over the film, and so remove the film.

Once the oxidized film is removed, the metal is again oxidized to form another oxidized film which is again removed utilizing the abrasive. The process is continued until the metal layer is removed to a required depth.

Slurries containing oxidizers may be unstable due to breakdown of the oxidizer over time resulting in unstable polish processes or production of toxic components. Replenishing and stabilizing these oxidizers are an added expense to be avoided. In addition, the spent slurry may have disposal issues and slurry oxidant requiring no waste treatment is desirable.

Another problem associated with the use of common chemical-mechanical polishing slurries is that they usually have pH values which are very low. Slurries having pH values which are very low are corrosive and may be the cause of damage to polishing equipment used in a chemical-mechanical polishing operation.

A further problem with conventional chemical-mechanical polishing slurries is that they cause "erosion", "dishing" and "recess" during polishing. Erosion is the preferential loss of a layer due to high metal pattern density, and dishing is the topography developed in a wide metal line due to the metal being preferentially polished in the middle of the line with respect to the edge of the line. Recess, is the uniform loss of metal within a structure due to chemical activity and is typically dominant in narrow metal lines. Erosion, dishing and recess are undesirable as a planar surface is usually required.

SUMMARY OF THE INVENTION

The invention provides a chemical-mechanical polishing slurry comprising a liquid, cerium ions as an oxidizer, an abrasive, and a pH increasing substance. The cerium ions are in the liquid in a quantity equal to the inclusion of at least 0.02 molar ammonium cerium nitrate in the liquid. The abrasive is also included in the liquid. The liquid, the cerium ions and the abrasive jointly have a first pH value. The pH increasing substance increases the first pH value to a second pH value above 1.5.

BRIEF DESCRIPTION OF THE DRAWINGS

The invention is further described by way of example with reference to the accompanying drawings wherein.

DETAILED DESCRIPTION OF THE INVENTION

Figure 1A:
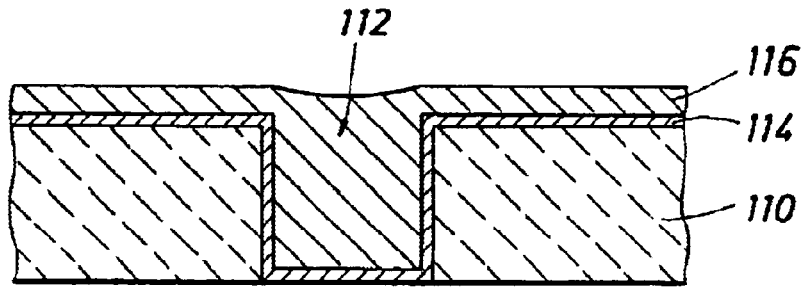
FIG. 1a is a side view illustrating a first layer, a barrier layer, and a metal layer which are formed on a substrate.

A chemical-mechanical polishing slurry, a method of preparing a chemical-mechanical polishing slurry, and a method of forming a metal line are described. In the following description, for purposes of explanation, numerous specific details are set forth in order to provide a thorough understanding of the present invention. It will be evident, however, to one skilled in the art, that the present invention may be practiced without these specific details.

The invention provides a chemical-mechanical polishing slurry, comprising cerium ions as an oxidizer, and, in addition to the oxidizer, an abrasive. The slurry is environmentally green in the sense that it does not require waste treatment when depleted. Because the slurry contains very little cyanide, expensive recirculation or destruction processes for depleted cyanide containing slurries are avoided.

The slurry has also been found to be selective to barrier materials such as tantalum, tantalum nitride, titanium, or titanium nitride, which makes such a material a good choice for a polish stop.

Cerium ions may be provided by adding and mixing a complex double salt such as ammonium cerium nitrate [$(NH_4)_2\ Ce(NO_3)_6$] together with the abrasive in deionized liquid water. The ammonium cerium nitrate dissolves in the water to provide $Ce^{+4}$ ions in solution in the water. The slurry preferably includes cerium ions in quantity equal to the use of 0.01 molar to 0.1 molar of ammonium cerium nitrate. Other sources of cerium ions may alternatively be used, such as a simple salt like cerium tetrasulfate [$Ce(SO_4)_2 \cdot 2H_2SO_4$] or a double salt like ammonium cerium sulfate [$(NH_4)_4Ce(SO_4)_4 \cdot 2H_2O$].

The slurry may be applied over a copper or other metal layer which is formed on a semiconductor substrate such as a silicon wafer. Cerium ions of the slurry may oxidize (remove electrons from) copper of the copper layer according to one of the following formulas:

The copper ions ($Cu^{+2}$ or $Cu^{+1}$) may then react with the water within the slurry to form a copper oxide film such as $Cu_2O$ or $CuO$ which, with the assistance of the abrasive is easily removable from the remainder of the copper layer during polishing.

The abrasive in the slurry may be silica ($SiO_2$), ceria ($CeO_2$), alumina ($Al_2O_3$) or any other suitable abrasive. The slurry may include between 1 percent and 30 percent of the abrasive by weight, more preferably between 1 percent and 5 percent of the abrasive by weight.

In all the examples that follow, a slurry is applied to a copper layer on an 8 inch diameter wafer at a rate of 200 milliliter per minute, the wafer and a polishing pad are rotated relative to one another at 280 revolutions per minute, and a pressure of about 4 pounds per square inch is applied between the wafer and the polish pad.

EXAMPLE 1

In one example a slurry was used which, in addition to deionize water, consisted of 0.05 molar ammonium cerium nitrate and 2.5 percent silicate by weight. The slurry has a pH value of 0.90. A polish rate of 5612 angstroms per minute (Å/min) was obtained. Polish uniformity across the wafer had a 1 σ variance of 8.3 percent.

In general, in the absence of a pH increasing substance, the slurry would have a pH below 1.5 if at least 0.02 molar ammonium cerium nitrate is used. To prevent damage to polishing equipment, the slurry preferably has a pH value of at least 1.5 and more preferably at least 2. The slurry may include a substance which increases its pH value. An amino acid such as glycine ($NH_2$—$CH_2$—$COOH$) may be used to increase the pH value of the slurry. Glycine also acts as a copper complexor, i.e. it is a complexing agent which "grabs" onto oxidized copper thereby increasing copper ion solubility and so assists removal of the oxidized copper. The complexing is proposed to be similar to complexing by ammonia ($NH_3$) that occurs at a high pH such as described in the references of J. M. Steigerwald, et al, "Chemical Mechanical Planarization of Microelectronic Materials" by John Wiley & Sons, Inc., and of V. Brusic, et al, "Electrochemical Approach to Au and Cu CMP Process Development" by the Electrochemical Society Proceeding Vol 96–22 and 176–185. Other substances which may be used to increase a pH value of the slurry include potassium hydroxide (KOH) and ammonium hydroxide ($NH_4OH$).

EXAMPLE 2

In another example a slurry was used comprising 0.05 molar ammonium cerium nitrate, 2.5 percent silica by weight, and 1 percent glycine by weight. The slurry has a pH value of 1.65. A polish rate of 4770 Å/min was obtained. Polish uniformity had a 1 σ variance of 8.3 percent.

EXAMPLE 3

In another example a slurry was used comprising 0.05 molar ammonium cerium nitrate, 2.5 percent silica by weight, and 2 percent glycine by weight. The slurry has a pH value of 2.26. A polish rate of 4784 Å/min was obtained. Polish uniformity had a 1 σ variance of 6.6 percent.

EXAMPLE 4

In another example a slurry was used comprising 0.05 molar ammonium cerium nitrate, 2.5 percent silica by weight, and 3 percent glycine by weight. The slurry has a pH value of 2.43. A polish rate of 5653 Å/min was obtained. Polish uniformity had a 1 σ variance of 4.3 percent.

EXAMPLE 5

In another example a slurry was used comprising 0.025 molar ammonium cerium nitrate, 1.25 percent silica by weight, and 2 percent glycine by weight. The slurry has a pH value of 3.2. A polish rate of 2794 Å/min was obtained. Polish uniformity had a 1 σ variance of 5.0 percent.

It can be seen by comparing Example 5 with Examples 2 to 4 that, although a reduction in cerium ion concentration substantially increases the pH value of the slurry, polish rate also decreases substantially. It is therefore preferred that the slurry comprises cerium ions equal to at least 0.05 molar ammonium cerium nitrate, while still having a sufficient amount of glycine, or another pH increasing substance, so that the slurry has a pH value of at least 2.

When certain metal layers, such as nickel, chromium, tungsten or aluminum metal layers, are oxidized, a thin oxide film forms on the metal layer which passivates the remainder of the metal layer, i.e. the oxide film prevents further oxidation of deeper laying metal of the metal layer. The oxide film is easier to remove than the remainder of the metal layer so that only the oxide film is removed during polishing with the remainder of the metal layer resisting removal and thus forming a "polish stop". Copper, however, does not form a stable, non-porous passivating oxide layer, i.e. copper continues to oxidize until an oxidizing agent to which the copper is exposed is removed, and does therefore not form a polish stop.

It is believed that the fact that copper does not form a stable, passivating oxide, and a polish stop, is the cause of more local polish non-uniformity, or more dishing, when a copper layer is planarized in a chemical-mechanical polishing operation, than would be the case when a layer of another metal, which does form a passivating layer, is planarized.

An anti-oxidizing agent or corrosion inhibitor may be included in the slurry to control, or at least reduce, oxidation of a metal such as copper, with corresponding less variation in polish uniformity or less dishing. One anti-oxidizing agent which may be used is benzotriazole (BTA, chemical formula: $C_6H_5N_2$)

Details of how BTA acts as an anti-oxidizing agent are described in the reference of R. Walker "Benzotriazole as a Corrosion Inhibitor for Antiques", Journal of Chemical Education, volume 57, 1980, pp. 789–791.

EXAMPLE 6

Table 1 includes test results for a slurry containing 2.5 percent silicate by weight, 3 percent glycine by weight, 0.05 molar ammonium cerium nitrate, and BTA in varying quantities.

TABLE 1

Test results for varying amounts of BTA

| BTA (molar) | pH | Polish Rate (Å/min) | 1 σ variance in Polish Uniformity (percent) |
| --- | --- | --- | --- |
| 0.00100 | 2.43 | 5653 | 8.3 |
| 0.00200 | 2.78 | 5884 | 3.3 |
| 0.00268 | 2.81 | 5790 | 2.7 |
| 0.00300 | 2.82 | 6158 | 3.4 |

TABLE 1-continued

Test results for varying amounts of BTA

| BTA (molar) | pH | Polish Rate (Å/min) | 1 σ variance in Polish Uniformity (percent) |
|---|---|---|---|
| 0.00400 | 2.88 | 6594 | 4.0 |
| 0.00500 | 2.82 | 5801 | 10.5 |
| 0.00514 | 2.78 | 347 | 6.8 |
| 0.00600 | 2.88 | 86 | 150 |

It can be seen from Table 1 that 1 σ variance in polish uniformity is between 2.7 percent and 4.0 percent for BTA concentrations of between 0.00200 molar and 0.00400 molar. The 1 σ variance in polish uniformity increases significantly for BTA concentrations above 0.00400 molar. Polish rate also decreases significantly for BTA concentrations above 0.00400 molar. The slurry therefore preferably includes between 0.00200 molar and 0.00500 molar BTA in order to keep polish rate to at least 1000 Å/min, and more preferably includes between 0.00200 molar and 0.00500 molar BTA in order to obtain acceptable polish uniformity.

Although the aforegoing description is primarily directed towards a slurry and a method of preparing a slurry, it should be understood, from the aforegoing description, that the invention also extends to a method of forming metal lines. The method of forming metal lines is now further described with reference to FIGS. 1a to 1d.

FIG. 1a shows a structure which is formed over a semiconductor substrate. A first layer 110, typically an interlayer dielectric layer, is formed over the substrate. An opening 112 is formed in the first layer 110. A barrier layer 114 is deposited onto the first layer 110 and on side walls and within a base of the opening 112. The barrier layer 110 is typically of tantalum, tantalum nitride, titanium/titanium nitride and prevents outdiffusing of metal from a metal layer which is eventually formed in the opening 112.

A metal layer 116 is then deposited over the barrier layer 114. The metal layer 116 fills the opening 112 completely and covers the barrier layer 114. The metal layer 116 may be deposited in a conventional plating or vapor deposition process. The metal layer is typically made of copper but may be made of another metal such as tungsten.

Figure 1B:
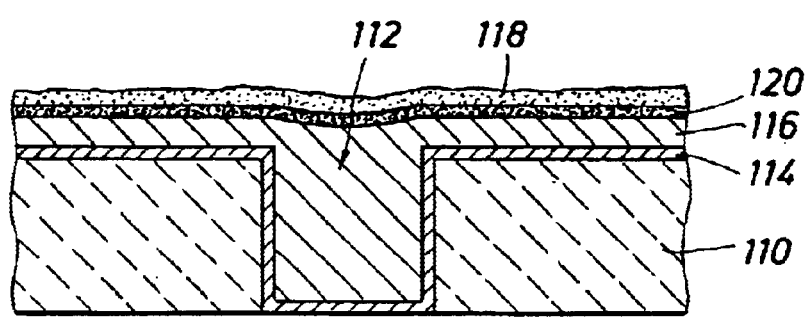
FIG. 1b is a view similar to FIG. 1a illustrating oxidation of a portion of the metal layer by a slurry.

As shown in FIG. 1b, a slurry 118, of the aforedescribed kind, is then applied over the metal layer 116. The slurry comprises cerium ions in quantity sufficient to oxidize a portion 120 of the metal layer 116.

Figure 1C:
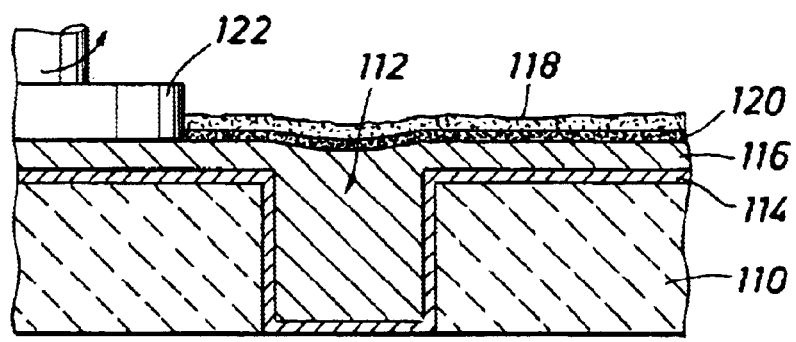
FIG. 1c is a view similar to FIG. 1b illustrating removal of the oxidized portion with a polishing pad.

When, as shown in FIG. 1C, a polishing surface of a polishing pad 122 is contacted against and moved over the metal layer, the oxidized portion of the metal layer 116 is removed. The slurry comprises abrasive in quality sufficient to assist in removal of the oxidized portion 120.

Figure 1D:
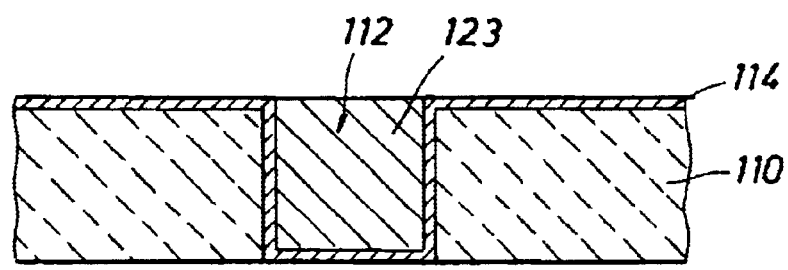
FIG. 1d is a view similar to FIG. 1c illustrating how the barrier layer also acts as a polish stop layer.

The process as shown in FIGS. 1a to 1c is repeated until, as shown in FIG. 1d, the barrier layer 114 is exposed and a metal line 123 remains within the opening 112. The cerium ions in the slurry are selective in that only the material of the metal layer 116 is oxidized, and not the material of the barrier layer 114. The barrier layer 114 is thus used as a polish stop layer which prevents further removal of material.

Thus, a chemical-mechanical polishing slurry, a method of preparing a chemical-mechanical polishing slurry, and a method of forming a metal line are described. While certain exemplary examples and embodiments have been described, it is to be understood that such examples and embodiments are merely illustrative and not restrictive of the current invention, and that this invention is not restricted to the specific examples of embodiments described, since modifications may occur to those ordinarily skilled in the art.

What is claimed:

1. A chemical-mechanical polishing slurry for a copper based metal layer on a semiconductor substrate, the chemical-mechanical polishing slurry comprising:

a liquid;

an oxidizer in the liquid, the oxidizer comprising a complex double salt of cerium;

an abrasive in the liquid, the liquid, the complex double salt of cerium and the abrasive together having a first pH value;

a pH increasing glycine substance in the liquid that increases the first pH value to a second pH value above 1.5 and below 3.0; and an anti-oxidizing BTA agent.

2. The slurry of claim 1 wherein the complex double salt of cerium comprises ammonium cerium nitrate ($(NH_4)_2 \cdot Ce(NO_3)_6$).

3. The slurry of claim 2 wherein a concentration of ammonium cerium nitrate is at least 0.02 molar in the liquid.

4. The slurry of claim 1 wherein the abrasive is silica.

5. The slurry of claim 1 wherein the second pH value is at least 2.5.

6. The slurry of claim 2 wherein a concentration of ammonium cerium nitrate is between 0.05 molar and 0.1 molar in the liguid.

7. The slurry of claim 1 comprising between 0.00200 molar and 0.00500 molar BTA.

8. The slurry of claim 1 wherein the complex double salt of cerium comprises ammonium cerium sulfate ($(NH_4)_4 \cdot Ce(SO_4)_4 \cdot 2H_2O$).

9. The slurry of claim 8 wherein the second pH value is at least 2.5.

10. A chemical-mechanical polishing slurry for polishing a copper based metal, the chemical-mechanical polishing slurry comprising:

a liquid;

an oxidizer comprising a complex double salt of cerium;

an abrasive in the liquid;

benzotriazole (BTA) in the liquid to inhibit corrosion; and a glycine complexing agent in the liquid and to increase a pH value of the slurry to above 1.5 and below 3.0.

11. The slurry of claim 10, comprising between 0.00100 molar and 0.00500 molar benzotriazole (BTA).

12. The slurry of claim 10, comprising between 1 and 3 percent glycine by weight.

13. The slurry of claim 10, wherein the liquid is deionized liquid water.

* * * * *

UNITED STATES PATENT AND TRADEMARK OFFICE
CERTIFICATE OF CORRECTION

PATENT NO. : 6,752,844 B2
DATED : June 22, 2004
INVENTOR(S) : Miller et al.

It is certified that error appears in the above-identified patent and that said Letters Patent is hereby corrected as shown below:

<u>Column 6,</u>
Line 35, delete "liguid" and insert -- liquid --.

Signed and Sealed this

Sixteenth Day of November, 2004

JON W. DUDAS
*Director of the United States Patent and Trademark Office*